US012696715B2

(12) United States Patent
Cong

(10) Patent No.: US 12,696,715 B2
(45) Date of Patent: Jul. 28, 2026

(54) FIN STRUCTURES, PLATE APPARATUS, AND RELATED METHODS, PROCESS KITS, AND PROCESSING CHAMBERS FOR GROWTH RATES AND PROCESS UNIFORMITY

(71) Applicant: Applied Materials, Inc., Santa Clara, CA (US)

(72) Inventor: Zhepeng Cong, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 56 days.

(21) Appl. No.: 18/748,661

(22) Filed: Jun. 20, 2024

(65) Prior Publication Data

US 2025/0132178 A1     Apr. 24, 2025

Related U.S. Application Data

(60) Provisional application No. 63/545,102, filed on Oct. 20, 2023.

(51) Int. Cl.
*H01L 21/67* (2006.01)
*H10P 72/00* (2026.01)

(52) U.S. Cl.
CPC ...... *H10P 72/0462* (2026.01); *H10P 72/0402* (2026.01); *H10P 72/0604* (2026.01)

(58) Field of Classification Search
CPC ........... H01L 21/6719; H01L 21/67017; H01L 21/67253
See application file for complete search history.

(56) References Cited

U.S. PATENT DOCUMENTS

| | | | |
|---|---|---|---|
| 5,685,906 | A | 11/1997 | Dietze et al. |
| 5,935,337 | A | 8/1999 | Takeuchi et al. |
| RE36,957 | E | 11/2000 | Brors et al. |
| 6,383,330 | B1 | 5/2002 | Raaijmakers |
| 8,216,375 | B2 | 7/2012 | Liu |

(Continued)

FOREIGN PATENT DOCUMENTS

| | | |
|---|---|---|
| CN | 113990780 A | 1/2022 |
| CN | 111893567 B | 2/2022 |

(Continued)

OTHER PUBLICATIONS

International Search Report and Written Opinion dated Oct. 14, 2024 for Application No. PCT/US2024/036599.

(Continued)

*Primary Examiner* — Paul J Gray
(74) *Attorney, Agent, or Firm* — Patterson + Sheridan, LLP

(57) ABSTRACT

The present disclosure relates to semiconductor processing chambers, and more particularly, to fin structures that facilitate growth rates and process uniformity. In one or more embodiments, a processing chamber applicable for use in semiconductor manufacturing includes one or more gas inlets operable to flow a gas into an internal volume of the processing chamber and a substrate support disposed in the internal volume. The processing chamber includes a plate apparatus disposed in the internal volume and above the substrate support. The plate apparatus includes a plate, and one or more fins disposed at least partially below the plate.

20 Claims, 12 Drawing Sheets

(56) References Cited

U.S. PATENT DOCUMENTS

| | | | |
|---|---|---|---|
| 8,512,472 | B2 | 8/2013 | Vatus et al. |
| 10,544,519 | B2 | 1/2020 | Savas et al. |
| 10,861,722 | B2 | 12/2020 | Colombeau et al. |
| 2005/0199184 | A1 | 9/2005 | Murugesh et al. |
| 2010/0120259 | A1 | 5/2010 | Vatus et al. |
| 2011/0006038 | A1 | 1/2011 | Kutney et al. |
| 2013/0045331 | A1 | 2/2013 | Kim et al. |
| 2013/0284097 | A1 | 10/2013 | Ranish et al. |
| 2014/0026816 | A1 | 1/2014 | Myo et al. |
| 2016/0002788 | A1 | 1/2016 | Nal et al. |
| 2016/0068959 | A1 | 3/2016 | Lau et al. |
| 2018/0025890 | A1 | 1/2018 | Choi et al. |
| 2018/0211850 | A1 | 7/2018 | Kondoh |
| 2018/0315626 | A1 | 11/2018 | Franklin |
| 2019/0393032 | A1 | 12/2019 | Yamamoto et al. |
| 2022/0056583 | A1 | 2/2022 | Tu et al. |
| 2022/0121196 | A1 | 4/2022 | Omori |
| 2022/0162751 | A1 | 5/2022 | Haanstra et al. |
| 2022/0170156 | A1 | 6/2022 | Jdira et al. |
| 2022/0181193 | A1 | 6/2022 | Gao et al. |
| 2022/0189804 | A1 | 6/2022 | Luan et al. |
| 2022/0199444 | A1 | 6/2022 | Oosterlaken et al. |
| 2022/0254668 | A1 | 8/2022 | Oosterlaken et al. |
| 2022/0268520 | A1 | 8/2022 | Oosterlaken et al. |
| 2022/0298643 | A1 | 9/2022 | Kajbafvala et al. |
| 2022/0298672 | A1 | 9/2022 | M'Saad et al. |
| 2022/0301829 | A1 | 9/2022 | Yoshikawa |
| 2022/0301905 | A1 | 9/2022 | Ye et al. |
| 2022/0301906 | A1 | 9/2022 | Naik et al. |
| 2022/0352006 | A1 | 11/2022 | Huang et al. |
| 2022/0359246 | A1 | 11/2022 | Umeoka |
| 2022/0380932 | A1* | 12/2022 | Cong ...................... C30B 25/14 |
| 2022/0411961 | A1 | 12/2022 | Preti et al. |
| 2023/0265580 | A1 | 8/2023 | Okabe |
| 2023/0386802 | A1 | 11/2023 | Cong et al. |
| 2023/0386803 | A1 | 11/2023 | Cong et al. |
| 2023/0407478 | A1 | 12/2023 | Cong et al. |
| 2024/0234175 | A9 | 7/2024 | Moradian et al. |
| 2024/0247405 | A1 | 7/2024 | Anastasopoulos et al. |
| 2024/0254624 | A1 | 8/2024 | Moradian et al. |
| 2024/0254627 | A1 | 8/2024 | Dhamodharan et al. |
| 2024/0254654 | A1 | 8/2024 | Cong et al. |
| 2024/0254655 | A1 | 8/2024 | Cong et al. |
| 2024/0258097 | A1 | 8/2024 | Patil |

FOREIGN PATENT DOCUMENTS

| | | | |
|---|---|---|---|
| CN | 114000192 | A | 2/2022 |
| CN | 111254487 | B | 3/2022 |
| CN | 114138030 | A | 3/2022 |
| CN | 114158145 | A | 3/2022 |
| CN | 114351249 | A | 4/2022 |
| CN | 111235551 | B | 5/2022 |
| CN | 114481311 | A | 5/2022 |
| CN | 114540947 | A | 5/2022 |
| CN | 114540948 | A | 5/2022 |
| CN | 114551331 | A | 5/2022 |
| CN | 114613703 | A | 6/2022 |
| CN | 114743924 | A | 7/2022 |
| CN | 114823428 | A | 7/2022 |
| CN | 114855272 | A | 8/2022 |
| CN | 114883221 | A | 8/2022 |
| CN | 114914181 | A | 8/2022 |
| CN | 114927450 | A | 8/2022 |
| CN | 115020281 | A | 9/2022 |
| CN | 115101432 | A | 9/2022 |
| CN | 115101443 | A | 9/2022 |
| CN | 115101470 | A | 9/2022 |
| CN | 115233303 | A | 10/2022 |
| CN | 115235257 | A | 10/2022 |
| CN | 115274510 | A | 11/2022 |
| CN | 115312432 | A | 11/2022 |
| CN | 115404543 | A | 11/2022 |
| JP | H08316154 | A | 11/1996 |
| JP | 3107055 | U | 1/2005 |
| KR | 101487411 | B1 | 1/2015 |
| KR | 20160003846 | A | 1/2016 |
| TW | 202225468 | A | 7/2022 |
| WO | 2020245493 | A1 | 12/2020 |
| WO | 2022040031 | A1 | 2/2022 |

OTHER PUBLICATIONS

International Search Report and Written Opinion dated May 10, 2023 for Application No. PCT/US2023/010889.

Non-Final Office Action dated Aug. 15, 2024 for U.S. Appl. No. 17/871,607.

Korean Office Action for Application No. 10-2024-7042703 dated Oct. 27, 2025.

Japanese Office Action dated Dec. 16, 2025 for Application No. 2024-569541.

\* cited by examiner

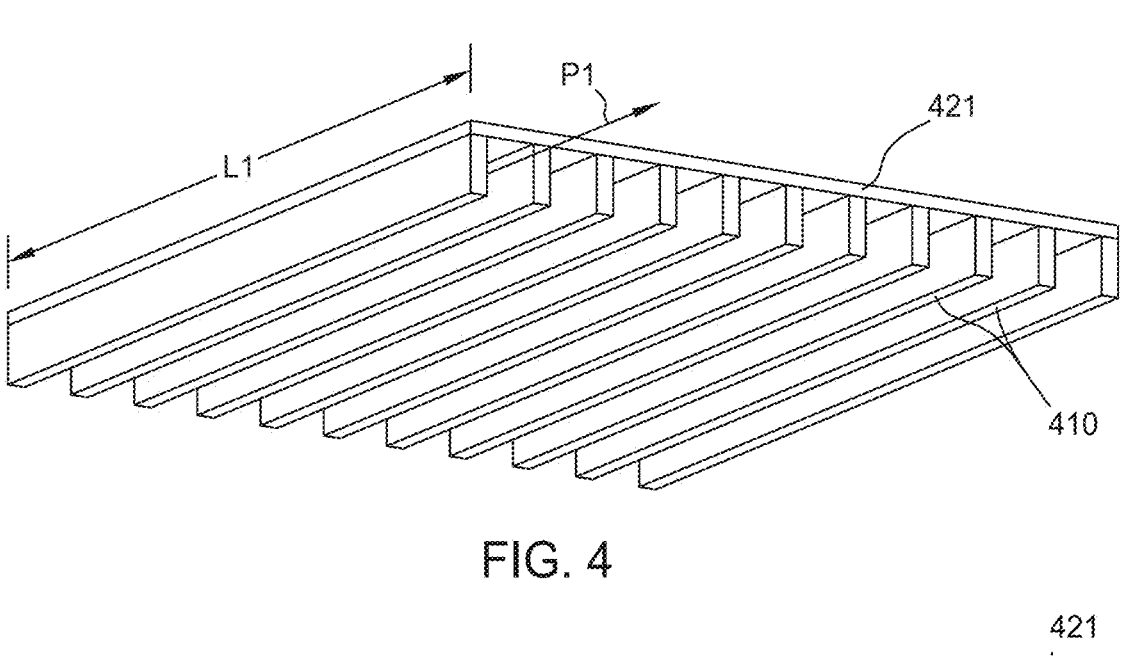
FIG. 4
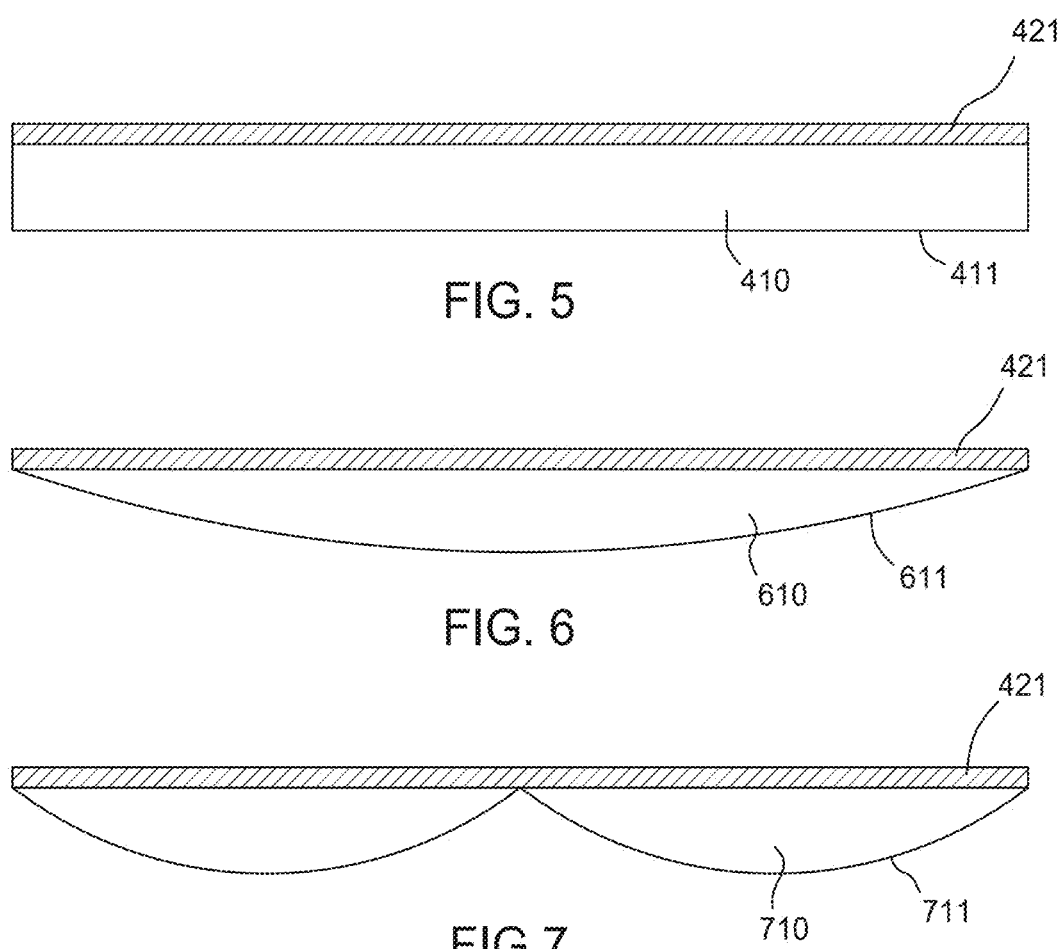
FIG. 5
FIG. 6
FIG.7

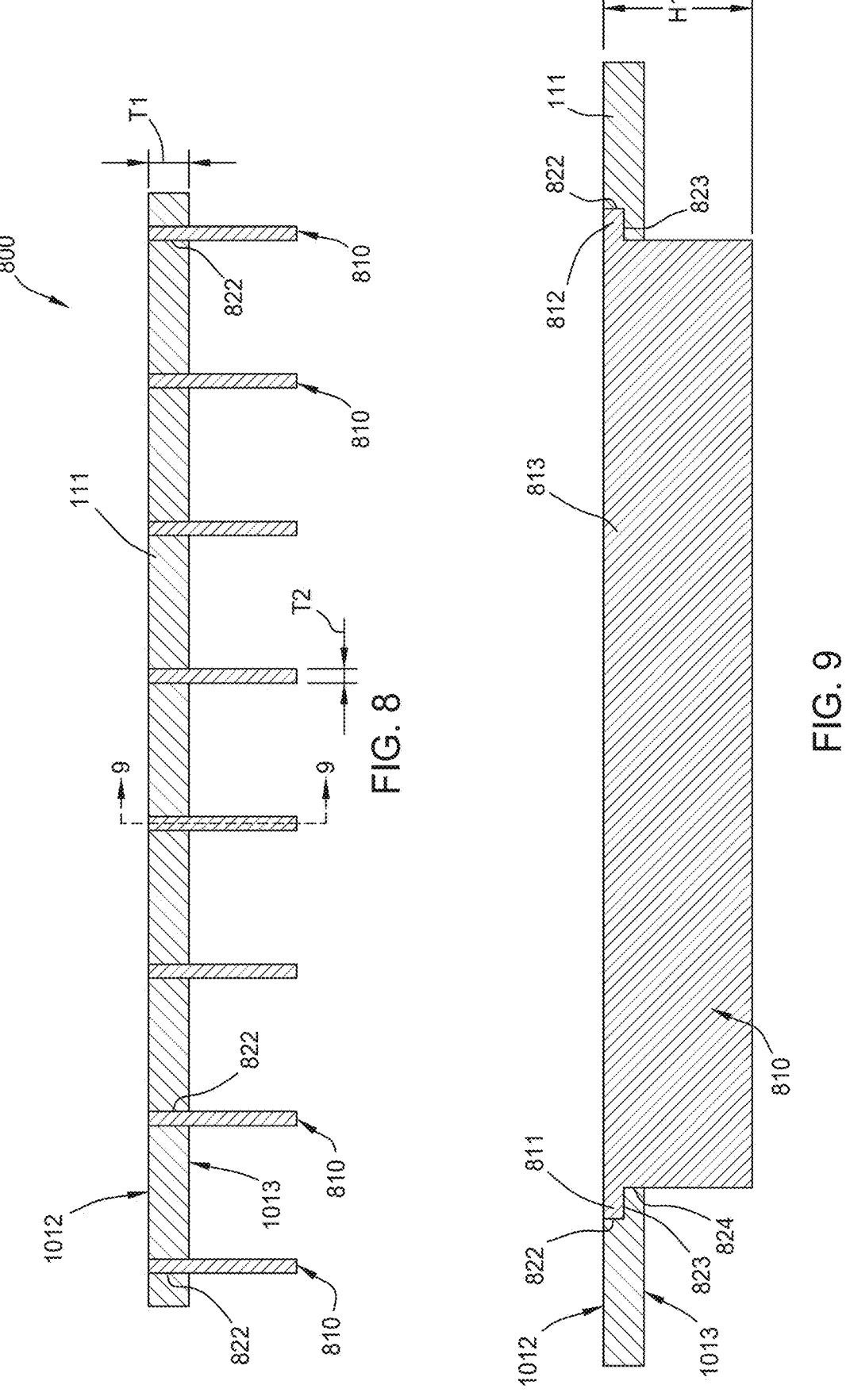

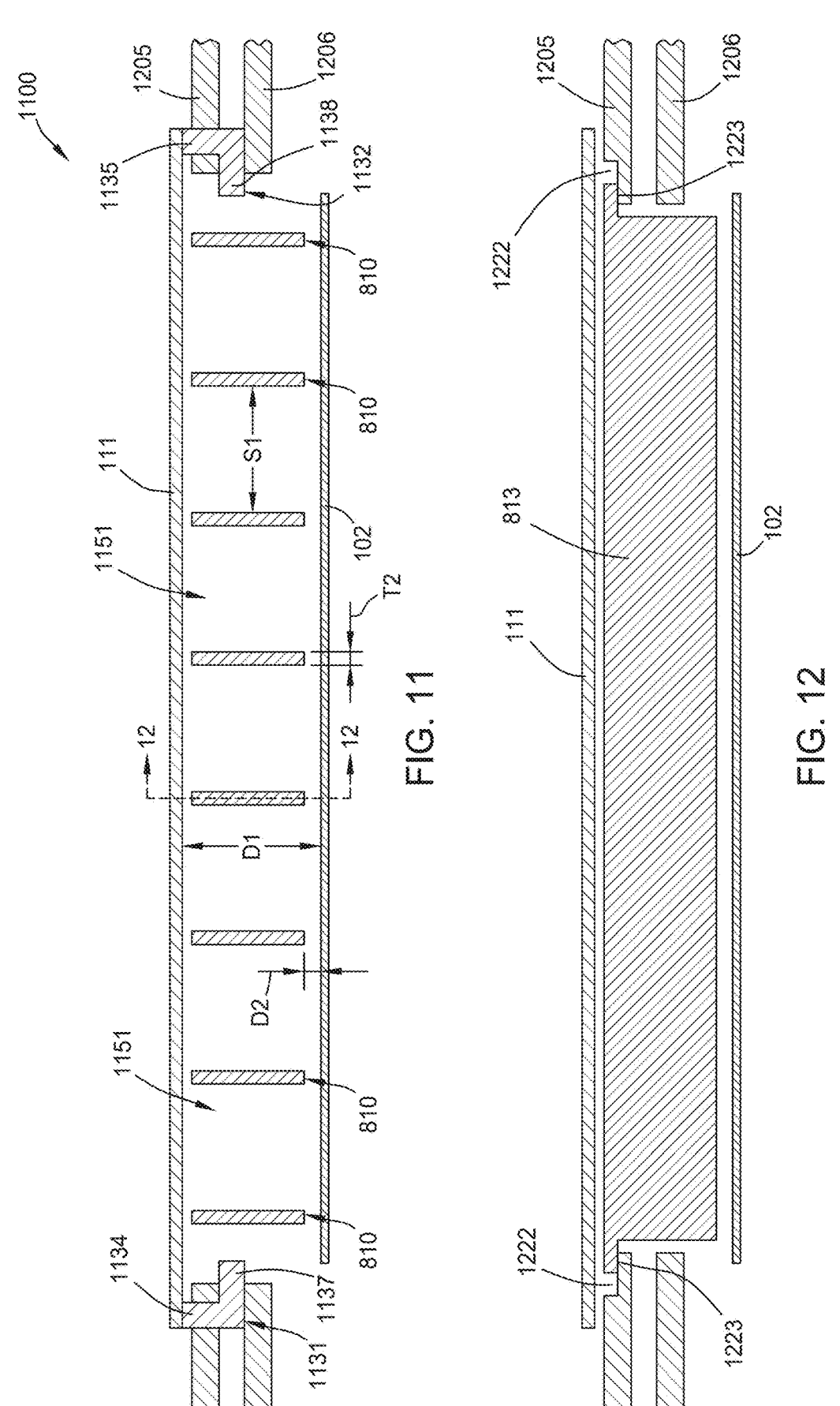

FIN STRUCTURES, PLATE APPARATUS, AND RELATED METHODS, PROCESS KITS, AND PROCESSING CHAMBERS FOR GROWTH RATES AND PROCESS UNIFORMITY

CROSS-REFERENCE TO RELATED APPLICATION

This application claims priority to U.S. provisional patent application Ser. No. 63/545,102, filed Oct. 20, 2023, which is herein incorporated by reference in its entirety.

BACKGROUND

Field

The present disclosure relates to semiconductor processing chambers, and more particularly, to fin structures that facilitate growth rates and process uniformity.

Description of the Related Art

Semiconductor substrates are processed for a wide variety of applications, including the fabrication of integrated devices and micro-devices. One method of processing substrates includes depositing a material, such as a dielectric material or a semiconductive material, on an upper surface of the substrate. The material may be deposited in a lateral flow chamber by flowing a process gas parallel to the surface of a substrate positioned on a support, and thermally decomposing the process gas to deposit a material from the gas onto the substrate surface. However, the material deposited on the surface of the substrate can be non-uniform in thickness, and therefore, negatively affects the performance of the manufactured device.

It can be difficult to adjust parameters (such as temperatures and gas flow rates) for deposition uniformity. It can also be difficult to activate gases for deposition. Rotation of the substrate, if used, can exacerbate adjustment difficulties. Relatively low rotation speeds, high pressures, and low flow rates can also exacerbate adjustment difficulties.

Therefore, a need exists for improved process chamber components.

SUMMARY

The present disclosure relates to semiconductor processing chambers, and more particularly, to fin structures that facilitate growth rates and process uniformity.

In one or more embodiments, a processing chamber applicable for use in semiconductor manufacturing includes one or more gas inlets operable to flow a gas into an internal volume of the processing chamber and a substrate support disposed in the internal volume. The processing chamber includes a plate apparatus disposed in the internal volume and above the substrate support. The plate apparatus includes a plate, and one or more fins disposed at least partially below the plate.

In one or more embodiments, a plate apparatus applicable for use in semiconductor manufacturing includes a plate and one or more fins. The plate is formed of a first composition. At least one of the one or more fins is formed of a second composition that is different than the first composition. The at least one of the one or more fins includes a first shoulder, a second shoulder, and a middle section extending between the first shoulder and the second shoulder.

In one or more embodiments, a plate apparatus applicable for use in semiconductor manufacturing includes a plate and one or more fins. The plate includes quartz. At least one of the one or more fins comprising silicon carbide (SIC). At least one of the one or more fins includes a first shoulder, a second shoulder, and a middle section extending between the first shoulder and the second shoulder.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4 is a schematic perspective view of an inner face of a plate, according to one or more embodiments.

FIG. 5 is a schematic cross-sectional side view of the plate shown in FIG. 4, according to one or more embodiments.

FIG. 6 is a schematic cross-sectional side view of the plate shown in FIG. 4, according to one or more embodiments.

FIG. 7 is a schematic cross-sectional side view of the plate shown in FIG. 4, according to one or more embodiments.

FIG. 8 is a schematic cross-sectional view of a plate apparatus, according to one or more embodiments.

FIG. 9 is a schematic cross-sectional view of the plate apparatus along Section 9-9 shown in FIG. 8, according to one or more embodiments.

FIG. 11 is a schematic cross-sectional view of a process kit, according to one or more embodiments.

FIG. 12 is a schematic cross-sectional view of the process kit along Section 12-12 shown in FIG. 11, according to one or more embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to semiconductor processing chambers, and more particularly, to fin structures that facilitate growth rates and process uniformity.

The disclosure contemplates that terms such as "couples," "coupling," "couple," and "coupled" may include but are not limited to embedding, bonding, welding, fusing, melting together, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling, such as indirect coupling through components such as links, blocks, and/or frames.

Figure 1:
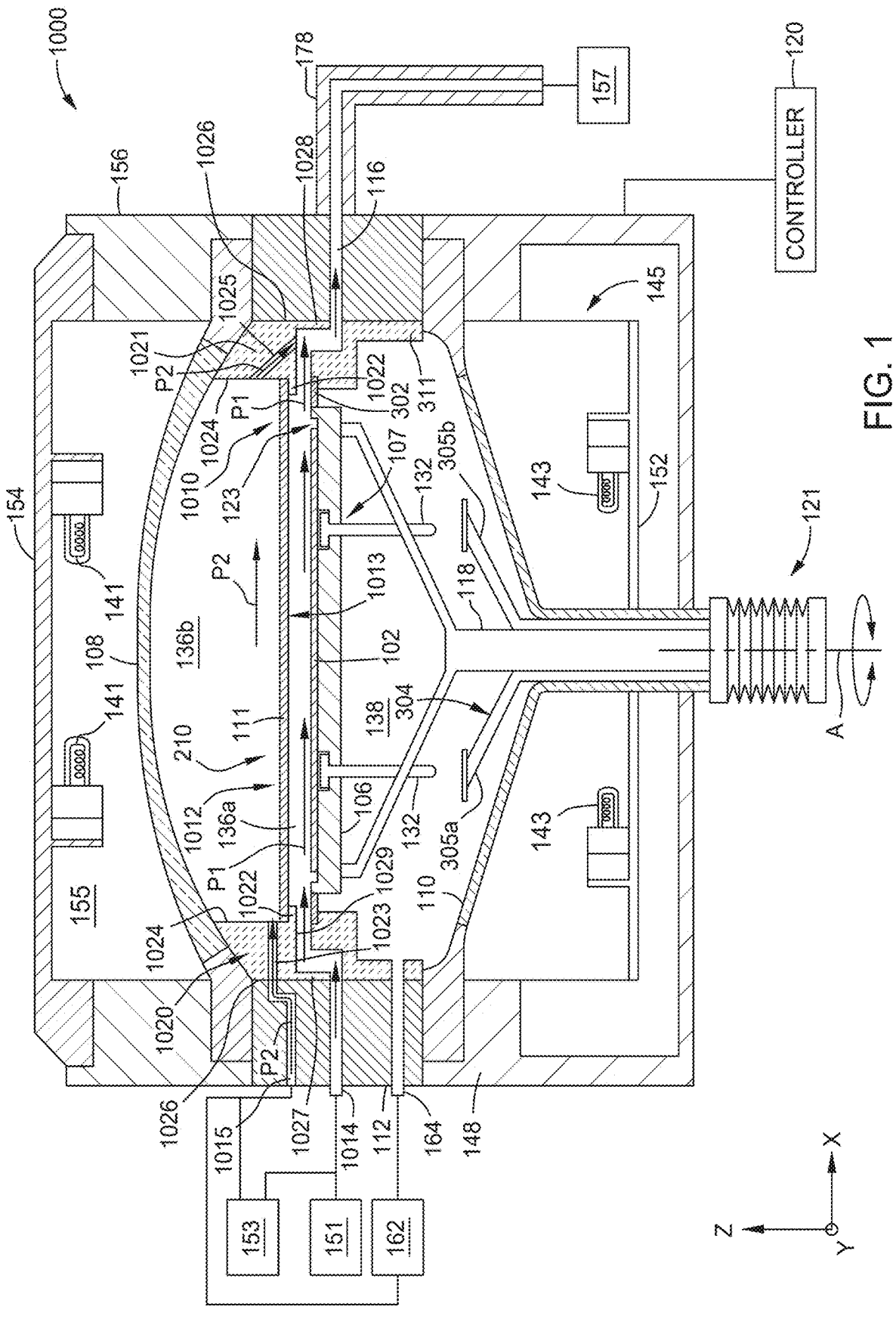
FIG. 1 is a partial schematic side cross-sectional view of a processing chamber, according to one or more embodiments.

FIG. 1 is a partial schematic side cross-sectional view of a processing chamber 1000, according to one or more embodiments. The processing chamber 1000 is a deposition chamber. In one or more embodiments, the processing chamber 1000 is an epitaxial deposition chamber. In one or more embodiments, the processing chamber 1000 is utilized to grow an epitaxial film on a substrate 102. The processing chamber 1000 creates a cross-flow of precursors across a top surface of the substrate 102. The processing chamber 1000 is shown in a processing condition in FIG. 1.

The processing chamber 1000 includes an upper body 156, a lower body 148 disposed below the upper body 156, a flow module 112 disposed between the upper body 156 and the lower body 148. The upper body 156, the flow module 112, and the lower body 148 form a chamber body. Disposed within the chamber body is a substrate support 106, an upper plate 108 (such as an upper window, for example an upper dome), a lower plate 110 (such as a lower window, for example a lower dome), a plurality of upper heat sources 141, and a plurality of lower heat sources 143. As shown, a controller 120 is in communication with the processing chamber 100 and is used to control processes and methods, such as the operations of the methods described herein. The present disclosure contemplates that each of the heat sources described herein can include one or more of: lamp(s), resistive heater(s), light emitting diode(s) (LEDs), and/or laser(s). The present disclosure contemplates that other heat sources can be used.

The substrate support 106 is disposed between the upper plate 108 and the lower plate 110. The substrate support 106 includes a support face 123 that supports the substrate 102. The plurality of upper heat sources 141 are disposed between the upper plate 108 and a lid 154. The plurality of upper heat sources 141 form a portion of the upper heat source module 155. The lid 154 may include a plurality of sensors (not shown) disposed therein or thereon for measuring the temperature within the processing chamber 100. The plurality of lower heat sources 143 are disposed between the lower plate 110 and a floor 152. The plurality of lower heat sources 143 form a portion of a lower heat source module 145. In one or more embodiments, the upper plate 108 is an upper dome and is formed of an energy transmissive material, such as quartz. In one or more embodiments, the lower plate 110 is a lower dome and is formed of an energy transmissive material, such as quartz. A pre-heat ring 302 is disposed outwardly of the substrate support 106. The pre-heat ring 302 is supported on a ledge of the lower liner 311. A stop 304 includes a plurality of arms 305a, 305b that each include a lift pin stop on which at least one of the lift pins 132 can rest when the substrate support 106 is lowered (e.g., lowered from a process position to a transfer position).

The internal volume has the substrate support 106 disposed therein. The substrate support 106 includes a top surface on which the substrate 102 is disposed. The substrate support 106 is attached to a shaft 118. The shaft 118 is connected to a motion assembly 121. The motion assembly 121 includes one or more actuators and/or adjustment devices that provide movement and/or adjustment for the shaft 118 and/or the substrate support 106.

The substrate support 106 may include lift pin perforations 107 disposed therein. The lift pin perforations 107 are sized to accommodate a lift pin 132 for lifting of the substrate 102 from the substrate support 106 either before or after a deposition process is performed.

A plate apparatus 210 includes an isolation plate 111 having a first outer face 1012 and a second outer face 1013 opposing the first outer face 1012. The second outer face 1013 faces the substrate support 106. A process kit 1010 includes an upper liner 1020 and the plate apparatus 210. The upper liner 1020 includes an annular section 1021. The upper liner 1020 includes one or more inlet openings 1023 extending to an inner surface 1024 of the annular section 1021 on a first side of the upper liner 1020, and one or more outlet openings 1025 extending to the inner surface 1024 of the annular section 1021 on a second side of the upper liner 1020.

The one or more inlet openings 1023 extend from an outer surface 1026 of the annular section 1021 of the upper liner 1020 to the inner surface 1024. The one or more outlet openings 1025 extend from a lower surface 1029 of the upper liner 1020 to the inner surface 1024. The upper liner 1020 includes a first extension 1027 and a second extension 1028 disposed outwardly of the lower surface 1029 of the upper liner 1020. At least part of the annular section 1021 of the upper liner 1020 is aligned with the first extension 1027 and the second extension 1028. In the embodiment shown in FIG. 1, a lowermost end of the isolation plate 111 is aligned above a lowermost end of the upper liner 1020. In one or more embodiments, as shown in FIG. 1, the lowermost end of the isolation plate 111 is part of the second outer face 1013, and the lowermost end of the upper liner 1020 is part of the first extension 1027 and/or the second extension 1028. The present disclosure contemplates that the lowermost end of the upper liner 1020 can be part of the lower surface 1029.

The isolation plate 111 is in the shape of a disc, and the annular section 1021 is in the shape of a ring. It is contemplated, however, that the isolation plate 111 and/or the annular section 1021 can be in the shape of a rectangle, or other geometric shapes. The isolation plate 111 at least partially fluidly isolates the upper portion 136b from the lower portion 136a.

The flow module 112 (which can define at least part of one or more sidewalls of the processing chamber 1000) includes one or more first inlet openings 1014 in fluid communication with the lower portion 136a of the processing volume 136. The flow module 112 includes one or more second inlet openings 1015 in fluid communication with the upper portion 136b of the processing volume 136. The one or more first inlet openings 1014 are in fluid communication with one or more flow gaps between the upper liner 1020 and the lower liner 311. The one or more second inlet openings 1015 are in fluid communication with the one or more inlet openings 1023 of the upper liner 1020. The first inlet openings 1014 are fluidly connected to one or more process gas sources 151 and one or more cleaning gas sources 153. The purge gas inlet(s) 164 are fluidly connected to one or more purge gas sources 162. The one or more gas exhaust outlets 116 are fluidly connected to an exhaust pump 157. One or more process gases supplied using the one or more process gas sources 151 can include one or more reactive gases (such as one or more of silicon-containing, phosphorus-containing, and/or germanium-containing gases, and/or one or more carrier gases (such as one or more of nitrogen (N$_2$) and/or hydrogen (H$_2$)). One or more purge gases supplied using the one or more purge gas sources 162 can include one or more inert gases (such as one or more of argon (Ar), helium (He), and/or nitrogen (N$_2$)). One or more cleaning gases supplied using the one or more cleaning gas sources 153 can include one or more of hydrogen and/or chlorine. In one embodiment, which can be combined with other embodiments, the one or more process gases include silicon phosphide (SiP) and/or phospine (PH$_3$), and the one or more cleaning gases include hydrochloric acid (HCl).

The one or more gas exhaust outlets 116 are further connected to or include an exhaust system 178. The exhaust system 178 fluidly connects the one or more gas exhaust outlets 116 and the exhaust pump 157. The exhaust system 178 can assist in the controlled deposition of a layer on the substrate 102. The exhaust system 178 is disposed on an opposite side of the processing chamber 100 relative to the flow module 112.

In one or more embodiments, as shown in FIG. 1, the one or more inlet openings 1023 are oriented in a horizontal orientation and the one or more outlet openings 1025 are oriented in an angled orientation. The present disclosure contemplates that the one or more inlet and/or outlet openings 1023, 1025 can be oriented in a horizontal orientation, oriented in an angled (e.g., non-parallel to horizontal) orientation, and/or can include one or more turns (such as the turns shown for the one or more first inlet openings 1014 and the one or more gas exhaust outlets 116).

During a deposition operation (e.g., an epitaxial growth operation), the one or more process gases P1 flow through the one or more first inlet openings 1014, through the one or more gaps, and into the lower portion 136a of the processing volume 136 to flow over the substrate 102. During the deposition operation, one or more purge gases P2 flow through the one or more second inlet openings 1015, through the one or more inlet openings 1023 of the upper liner 1020, and into the upper portion 136b of the processing volume 136. The one or more purge gases P2 flow simultaneously with the flowing of the one or more process gases P1. The flowing of the one or more purge gases P2 through the upper portion 136b facilitates reducing or preventing flow of the one or more process gases P1 into the upper portion 136b that would contaminate the upper portion 136b. The one or more process gases P1 are exhausted through gaps between the upper liner 1020 and the lower liner 311, and through the one or more gas exhaust outlets 116. The one or more purge gases P2 are exhausted through the one or more outlet openings 1025, through the same gaps between the upper liner 1020 and the lower liner 311, and through the same one or more gas exhaust outlets 116 as the one or more process gases P1. The present disclosure contemplates that that one or more purge gases P2 can be separately exhausted through one or more second gas exhaust outlets that are separate from the one or more gas exhaust outlets 116.

The present disclosure also contemplates that one or more purge gases can be supplied to the purge volume 138

(through the plurality of purge gas inlets 164) during the deposition operation, and exhausted from the purge volume 138.

Figure 2:
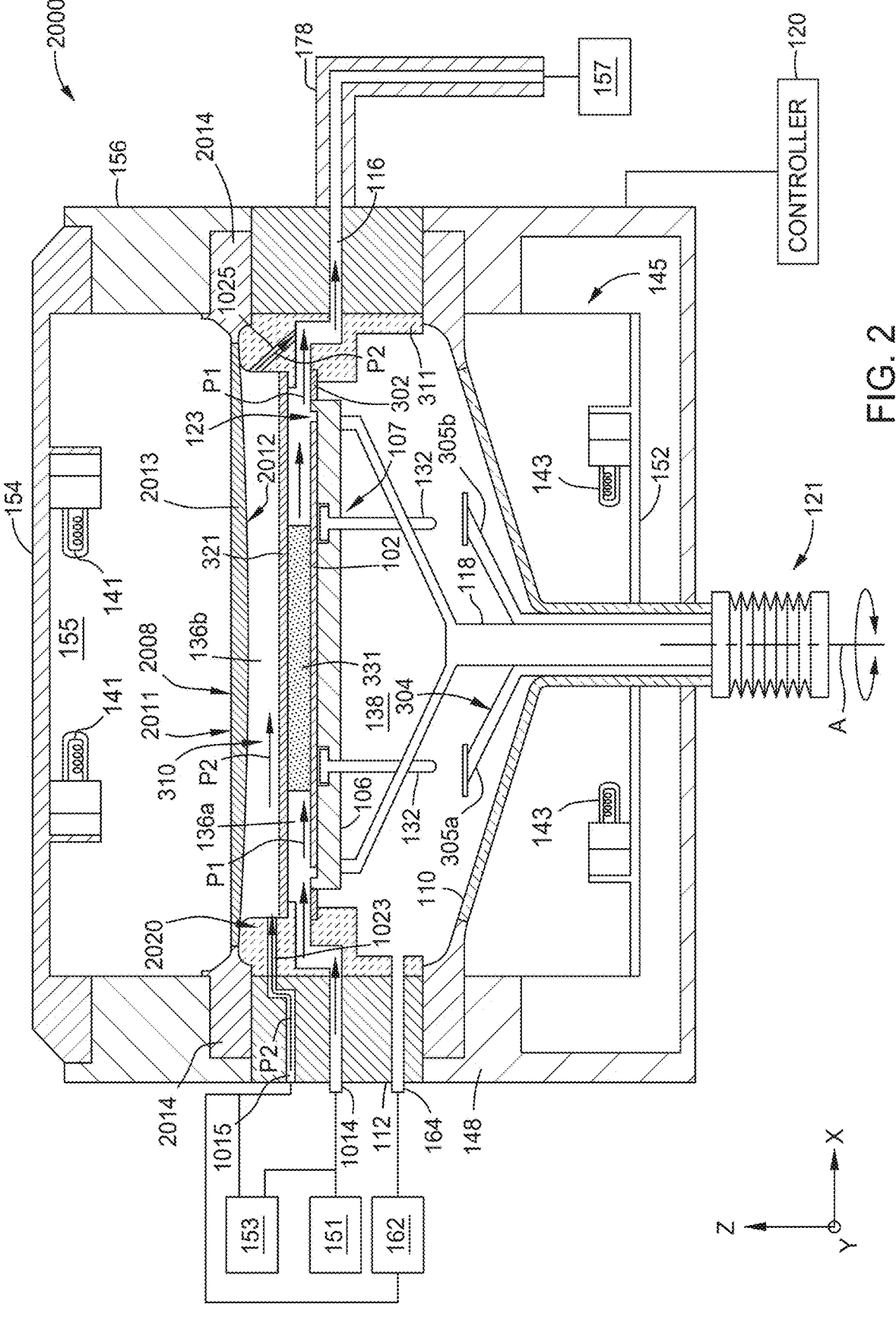
FIG. 2 is a partial schematic side cross-sectional view of a processing chamber, according to one or more embodiments.

FIG. 2 is a partial schematic side cross-sectional view of a processing chamber 2000, according to one or more embodiments. The processing chamber 2000 is similar to the processing chamber 1000 shown in FIG. 1, and includes one or more of the aspects, features, components, properties, and/or operations thereof. The processing chamber 2000 is shown in a processing condition in FIG. 2.

The processing chamber 2000 includes a plate 2008 (such as a window) that at least partially defines the processing volume 136. The plate 2008 includes a first face 2011 that is concave or flat (in the embodiment shown in FIG. 2, the first face 2011 is flat). The plate 2008 includes a second face 2012 that is convex. The second face 2012 faces the substrate support 106.

The processing chamber 2000 includes a liner 2020. The liner 2020 is similar to the upper liner 1020 shown in FIG. 1, and includes one or more of the aspects, features, components, properties, and/or operations thereof. The processing chamber 2000 incudes a process kit 310 (shown in FIG. 3), which includes an isolation plate 321, and a first block 331 and a second block 332 coupled to the isolation plate 321. The first block 3331 and the second block 332 are oriented parallel to each other. The first block 331 is disposed below the isolation plate 321 and above the substrate support 106. The blocks 331, 332 assist with flow of process gas P1 over the substrate 102 to facilitate improving deposition uniformity. In one or more embodiments, the plate 321 and the blocks 331, 332 are supported by and/or coupled to the upper liner 1020 and/or the pre-heat ring 302. In one or more embodiments, the plate 321 and the blocks 331, 332 rest on the upper liner 1020 and/or the pre-heat ring 302.

The plate 2008 includes an inner section 2013 and an outer section 2014. The first face 2011 and the second face 2012 are at least part of the inner section 2013. In one or more embodiments, the inner section 2013 is transparent and the outer section 2014 is opaque. The outer section 2014 is received at least partially in one or more sidewalls (such as in the flow module 112 and/or the upper body 156) of the processing chamber 2000.

Figure 3:
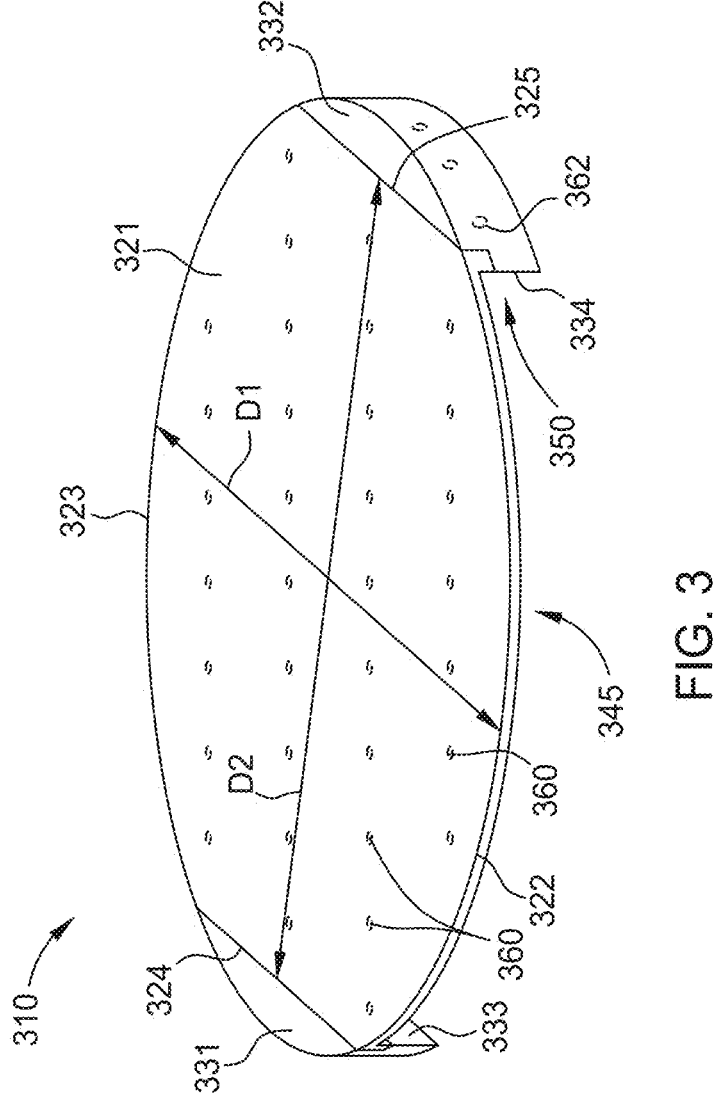
FIG. 3 is a schematic partial perspective view of the process kit, according to one or more embodiments.

FIG. 3 is a schematic partial perspective view of the process kit 310, according to one or more embodiments. The first block 331 and the second block 332 are disposed opposite one another, on opposing sides of the plate 321. The plate 321 and the two blocks 331, 332 together are part of a flow guide insert that has a circular shape, and other geometric configurations are contemplated.

The isolation plate 321 includes a first side 322 and a second side 323 opposing the first side 322 along a first direction D1. Each of the first side 322 and the second side 323 is arcuate. In one or more embodiments, the direction D1 is parallel to the direction of gas flow in the process chambers 1000, 2000 of FIGS. 1 and 2 in order to guide process gas P1 within the rectangular flow opening 350 defined between a planar inner surface 333 of the first block 331 and a planar inner surface 334 of the second block 332.

The first block 331 extends outwardly from and couples to a third side 324 of the isolation plate 321, and the second block 332 extends outwardly from and couples to a fourth side 325 of the isolation plate 321. The third side 324 is opposite the fourth side 325 along a direction D2, which is perpendicular to direction D1. The third side 324 and the fourth side 325 are linear, as are surfaces of the first block 331 and the second block 332 which mate with the third side 324 and the fourth side 325 of the isolation plate 321.

It is contemplated that the first block 331 and the second block 332 may be omitted from the flow guide insert (as shown in FIG. 1). In one or more embodiments where the blocks 331 and 332 are omitted, the isolation plate 321 can be supported by the upper liner 1020 and/or the isolation plate 321 may be secured in the interior of the processing chamber via another attachment mechanism.

It is contemplated that in embodiments with the first and second blocks 331, 332, the size of the blocks may be varied to increase or decrease the lower portion 136a of the processing volume 136. It is also contemplated that the first and second blocks 331, 332 may include actuating supports configured to mechanically move the isolation plate 321 up and down.

During processing, one or more process gases (such as process gas P1 of FIGS. 1 and 2) flow through the rectangular flow opening 350 when flowing through the lower portion 136a and over the substrate 102. The rectangular flow opening 350 facilitates adjustability of process gases, purge gases, and/or cleaning gases (such as pressure and flow rate), to facilitate process uniformity and deposition uniformity while providing a path for cleaning gases to the upper portion 136b. As an example, the rectangular flow opening 350 facilitates using high pressures and low flow rates for the process gases and the cleaning gases. The rectangular flow opening 350 also facilitates mitigation of the effects that rotation of the substrate 102 has on process uniformity and film thickness uniformity during a deposition operation. As an example, the rectangular flow opening mitigates or removes the effects of gas vortex.

As shown in FIG. 3, the isolation plate 321 can include a plurality of openings 360 (e.g., perforations) formed therethrough, and/or the blocks 331, 332 can include a plurality of openings 362 (e.g., perforations). It is to be noted that while openings 362 are only shown in the second parallel block 332 in FIG. 3 for clarity, openings 362 are also formed in the first block 331.

The openings 360 and/or the openings 362 can be omitted (as shown in FIG. 1) from the isolation plate 321, the first block 331, and/or the second block 332.

FIG. 4 is a schematic perspective view of an inner face of a plate 421, according to one or more embodiments. As shown in FIG. 4, the one or more process gases P1 flow through flow paths between a plurality of fins 410. In one or more embodiments, the fins 410 are coupled to the plate 421. As an example, the fins 410 can be welded, bonded, and/or fused to the plate 421. The present disclosure contemplates that the fins 410 can be integrally formed with the plate 421. The present disclosure also contemplates that the fins 410 can be supported by the plate 421, as described for example in relation to the fins 810 and the plate apparatus 800 described below.

FIG. 5 is a schematic cross-sectional side view of the plate 421 shown in FIG. 4, according to one or more embodiments. As shown in FIGS. 4 and 5, the fins 410 have a planar edge 411.

FIG. 6 is a schematic cross-sectional side view of the plate 421 shown in FIG. 4, according to one or more embodiments. As shown in FIG. 6, fins 610 have an arcuate edge 611.

FIG. 7 is a schematic cross-sectional side view of the plate 421 shown in FIG. 4, according to one or more embodiments. As shown in FIG. 7, fins 710 have a patterned edge 711 such that multiple arcs are included along the length L1 for each fin 710.

FIG. 8 is a schematic cross-sectional view of a plate apparatus 800, according to one or more embodiments. The plate apparatus 800 includes the plate 111 (e.g., an isolation plate) and one or more fins 810 (a plurality of shown). The plate 111 is formed of a first composition and at least one (such as one or all) of the one or more fins 810 are formed of a second composition that is different than the first composition. In one or more embodiments, the first composition is transparent and the second composition is at least partially opaque. The at least one of the one or more fins 810 has a lower transmissivity than the plate 111 for radiation (e.g., light) in the infrared wavelength range. The at least one of the one or more fins 810 has a higher absorptivity than the plate 111 for radiation (e.g., light) in the infrared wavelength range. The second composition includes one or more of black quartz, graphite, or silicon carbide (SiC). In one or more embodiments, the SiC includes solid SiC, such as sintered SiC. In one or more embodiments, the second composition includes SiC (such as polycrystalline SiC), and the SiC has an atomic structure that is 4H (a hexagonal structure), 6H (a hexagonal structure), or 3C (a cubic structure). The SiC having the 4H atomic structure can be semi-translucent. In one or more embodiments, the second composition is formed of SiC (for example solid SiC, such as sintered SiC) or includes graphite coated with SiC. The first composition includes quartz (such as transparent quartz).

In one or more embodiments, the at least one of the one or more fins 810 has a bandgap of at least 2.00 eV and a thermal conductivity of at least 300 W/m-K at about 300 degrees Kelvin. In one or more embodiments, the bandgap is within a range of 2.25 eV to 3.5 eV. In one or more embodiments, the thermal conductivity is within a range of 310 W/m-K at about 300 degrees Kelvin to 360 W/m-K at about 300 degrees Kelvin. At least one (such as one or all) of the one or more fins 810 extend (e.g., downwardly) relative to the second outer face 1013 of the plate 111.

The plate 111 has a first thickness T1. In one or more embodiments, the first thickness T1 is within a range of 3.0 mm to 5.0 mm, such as within a range of 4.0 mm to 5.0 mm. In one or more embodiments, at least one (such as one or all) of the one or more fins 810 have a second thickness T2 within a range of 0.1 mm to 4.0 mm, such as 3.0 mm to 4.0 mm. In one or more embodiments, the second thickness T2 is within a range of 0.3 mm to 0.5 mm, such as about 0.4 mm. In one or more embodiments, the second thickness T2 is within a range of 1.3 mm to 1.7 mm, such as about 1.5 mm. In one or more embodiments, the first thickness T1 is larger than the second thickness T2 of at least one (such as one or all) of the one or more fins 810.

FIG. 9 is a schematic cross-sectional view of the plate apparatus 800 along Section 9-9 shown in FIG. 8, according to one or more embodiments.

In the implementation shown in FIGS. 8 and 9, the plate 111 includes one or more openings 822 (a plurality is shown) formed in the first outer face 1012 and defining one or more recessed surfaces 823 (a plurality is shown). The one or more fins 810 are sized and shaped for positioning in the one or more openings 822.

At least one (such as one or all) of the one or more fins 810 includes a first shoulder 811, a second shoulder 812, and a middle section 813 extending between the first shoulder 811 and the second shoulder 812. The first shoulder 811 and second shoulder 812 are sized and shaped to interface with at least one of the one or more recessed surfaces 823. In one or more embodiments, the first shoulder 811 and the second shoulder 812 of the respective fin 810 interfaces with (e.g., is supported on). A pair of recessed surfaces 823 on opposing sides of a hole 824 extending from the respective opening 822 and to the second outer face 1013. The respective fin 810 extends through the respective hole 824 and past the second outer face 1013.

In one or more embodiments, the one or more fins 810 are dropped respectively into the openings 822 and the holes 824, and are supported (e.g., using gravitational forces) respectively by the respective pairs of recessed surfaces 823 such that the one or more fins 810 are suspended from the plate 111. In one or more embodiments, the middle section 813 has a height $H_1$ within a range of 8 mm to 12 mm. In one or more embodiments, the height $H_1$ is within a range of 9.5 mm to 10.5 mm, such as about 10 mm.

Figure 10:
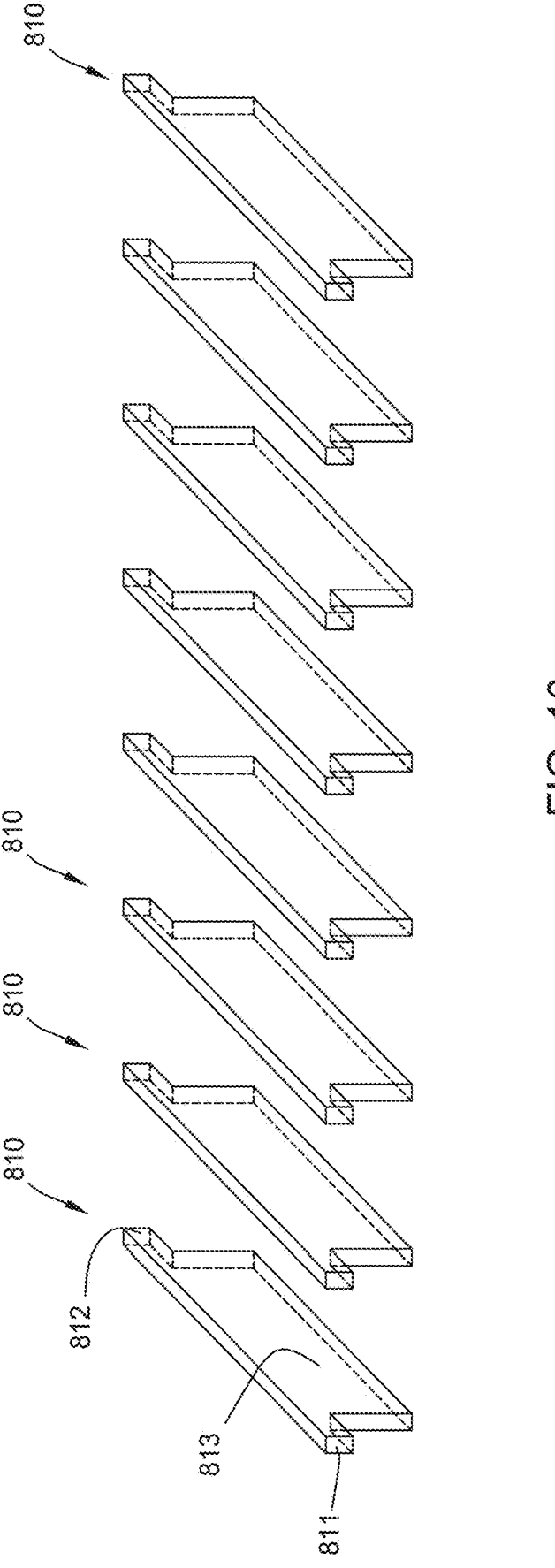
FIG. 10 is a schematic perspective view of the plurality of fins shown in FIGS. 8 and 9, according to one or more embodiments.

FIG. 10 is a schematic perspective view of the plurality of fins 810 shown in FIGS. 8 and 9, according to one or more embodiments.

FIG. 11 is a schematic cross-sectional view of a process kit 1100, according to one or more embodiments. The process kit 1100 includes one or more aspects, features, components, operations, and/or properties of the plate apparatus 800 shown in FIGS. 8 and 9.

FIG. 12 is a schematic cross-sectional view of the process kit 1100 along Section 12-12 shown in FIG. 11, according to one or more embodiments.

In the implementation shown in FIGS. 11 and 12, the openings 822 are omitted from the plate 111. The one or more process gases P1 flow between a first ring 1205 (e.g., a first pre-heat ring) and a second ring 1206 (e.g., a second pre-heat ring) as the one or more process gases P1 are injected into the lower portion 136*a* and exhausted from the lower portion 136*a*. In one or more embodiments, the first ring 1205 and the second ring 1206 are coupled (e.g., integrally formed or welded) together. The first ring 1205 is sized and shaped to at least partially surround the middle section 813 of the one or more fins 810.

The first ring 1205 includes one or more openings 1222 (a plurality is shown) defining one or more recessed surfaces 1223 (a plurality is shown). The one or more fins 810 are sized and shaped for positioning in the one or more openings 1222, and the first shoulder 811 and second shoulder 812 are sized and shaped to interface with at least one of the one or more recessed surfaces 1223 such that the one or more fins 810 are suspended from the first ring 1205.

The process kit 1100 includes a set of blocks 1131, 1132 between the first and second rings 1205, 1206. The set of blocks 1131, 1132 are supported on the second ring 1206, and are disposed on opposing sides of the one or more fins 810. The fins 810 are spaced from each other by a spacing S1 between the blocks 1131, 1132. In one or more embodiments, the spacing S1 is at least 10 mm, such as within a range of 15 mm to 25 mm, for example about 20 mm. The spacing S1 can be uniform or non-uniform. The second ring 1206 and the blocks 1131, 1132 can be raised and lowered, for example, using the substrate support 106. As an example, the substrate support 106 can be raised to contact the second ring 1206, and continued raising of the substrate support 106 raises the second ring 1206 and the blocks 1131, 1132. The blocks 1131, 1132 are disposed between the inject side and the exhaust side of the processing chamber. The present disclosure contemplates that the blocks 1131, 1132 can be disposed respectively on the inject side and the exhaust side.

During processing, the one or more process gases P1 flow through gaps 1151 between the fins 810. The fins 810 can absorb and/or emit heat received, for example, from the upper heat sources 141, 143 while reducing or eliminating blockage of heat that radiates to heat the substrate 102. The heat of the fins 810 can facilitate activating the one or more process gases P1 flowing in the gaps 1151, which facilitates enhanced deposition uniformity, increased growth rates and film thickness, and adjustability of thermal profiles and/or deposition profiles across the substrate 102.

The set of blocks 1131, 1132 include one or more ledges 1137, 1138 spaced from the plate 111. The one or more ledges 1137, 1138 are sized and shaped to interface with the first ring 1205. Raising and lowering of the blocks 1131, 1132 can raise and lower the first ring 1205 and the fins 810 supported on the first ring 1205. The blocks 1131, 1132 are sized and shaped to interface with the plate 111. The blocks 1131, 1132 include a respective extension 1134, 1135 extending through openings formed in the first ring 1205. Raising and lowering of the extensions 1134, 1135 can raise and lower the plate 111. A distance D1 between the plate 111 and the substrate 102 can be adjusted for processing. In one or more embodiments, the distance D1 is within a range of 10 mm to 15 mm, such as 11 mm to 13 mm, for example about 12 mm. The blocks 1131, 1332 and the first ring 1205 can be sized and shaped to simultaneously raise and lower the plate 111 and the fins 810 on the first ring 1205. The blocks 1131, 1332 and the first ring 1205 can be sized and shaped to first raise or lower one of the plate 111 or the first ring 1205 for a predetermined distance prior to contacting and then raising or lowering the other of the plate 111 or the first ring 1205. A distance D2 between the fins 810 and the substrate 102 can be adjusted for processing. In one or more embodiments, the distance D2 is within a range of 1 mm to 5 mm, such as 1.5 mm to 2.5 mm, for example about 2.0 mm.

The blocks 1131, 1132, the first ring 1205, and/or the second ring 1206 can be formed of one or more of the same material(s) as the plate 231 and/or the fins 810. In one or more embodiments, the blocks 1131, 1132, the first ring 1205, and/or the second ring 1206 include SiC. In one or more embodiments, the blocks 1131, 1132, the first ring 1205, and/or the second ring 1206 are formed of SiC or graphite coated with SiC. The first ring 1205 and/or the second ring 1206 can include one or more ring segments such as a complete ring, a ring segment having a notch, a C-ring, or a plurality of ring segments spaced from each other.

Figure 13:
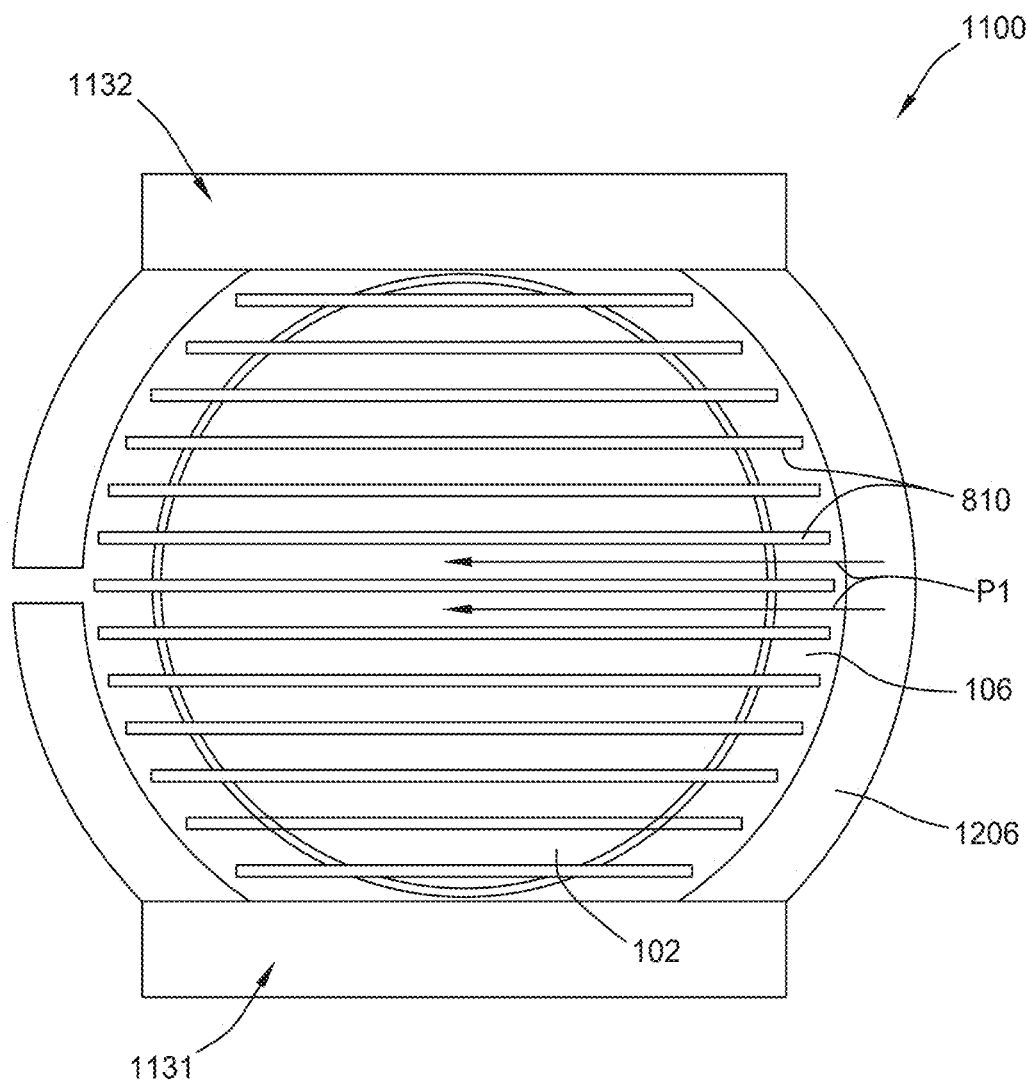
FIG. 13 is a schematic top view of the set of blocks, the second ring, and the fins shown in FIGS. 11 and 12, according to one or more embodiments.

FIG. 13 is a schematic top view of the set of blocks 1131, 1132, the second ring 1206, and the fins 810 shown in FIGS. 11 and 12, according to one or more embodiments.

Figure 14:
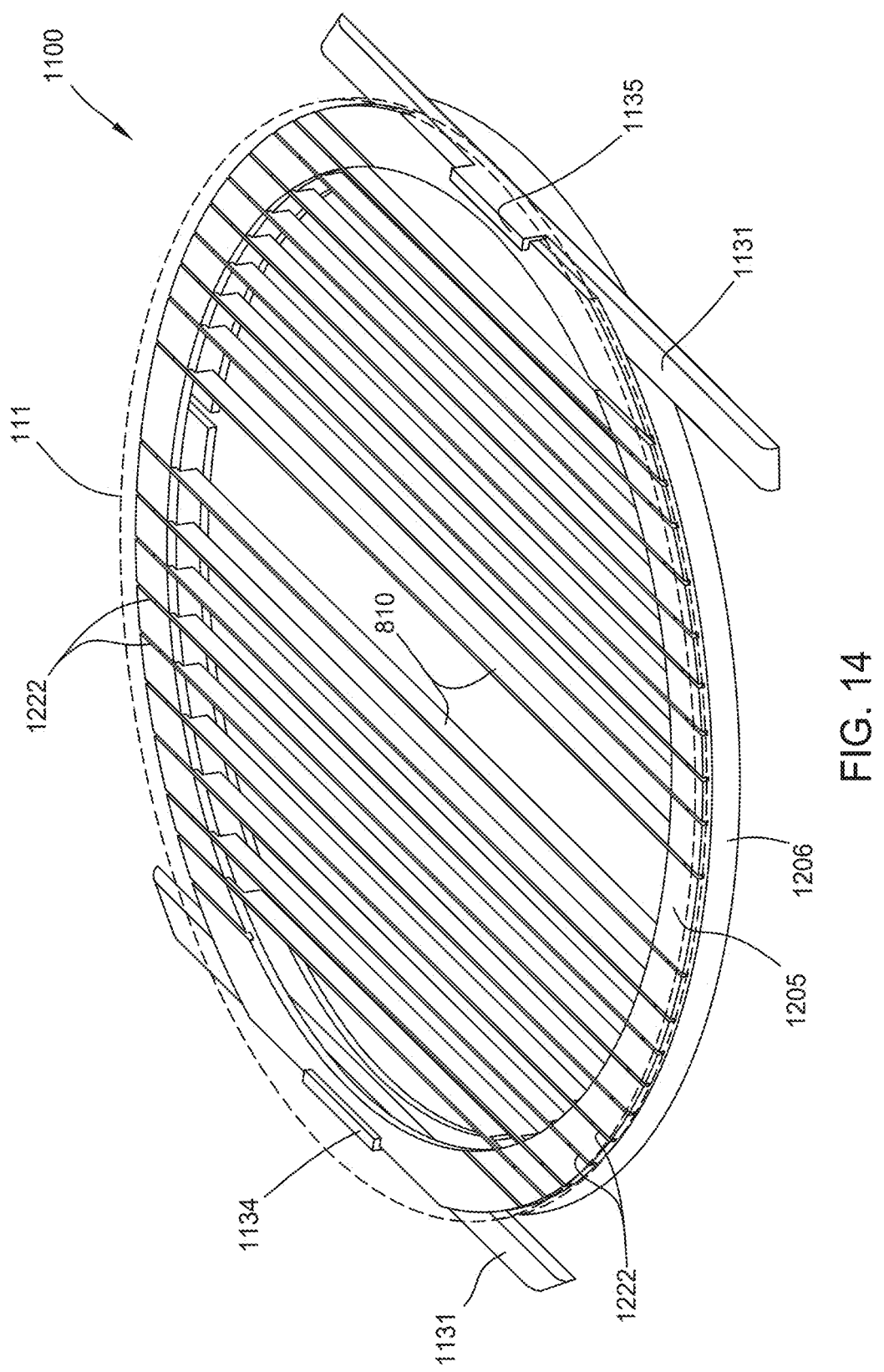
FIG. 14 is a schematic perspective view of the process kit shown in FIGS. 11 and 12, according to one or more embodiments.

FIG. 14 is a schematic perspective view of the process kit 1100 shown in FIGS. 11 and 12, according to one or more embodiments.

In the implementation shown in FIG. 14, the openings 1222 extend from an inner diameter to an outer diameter of the first ring 1205 along an upper face of the first ring 1205.

Figures 15, 16:
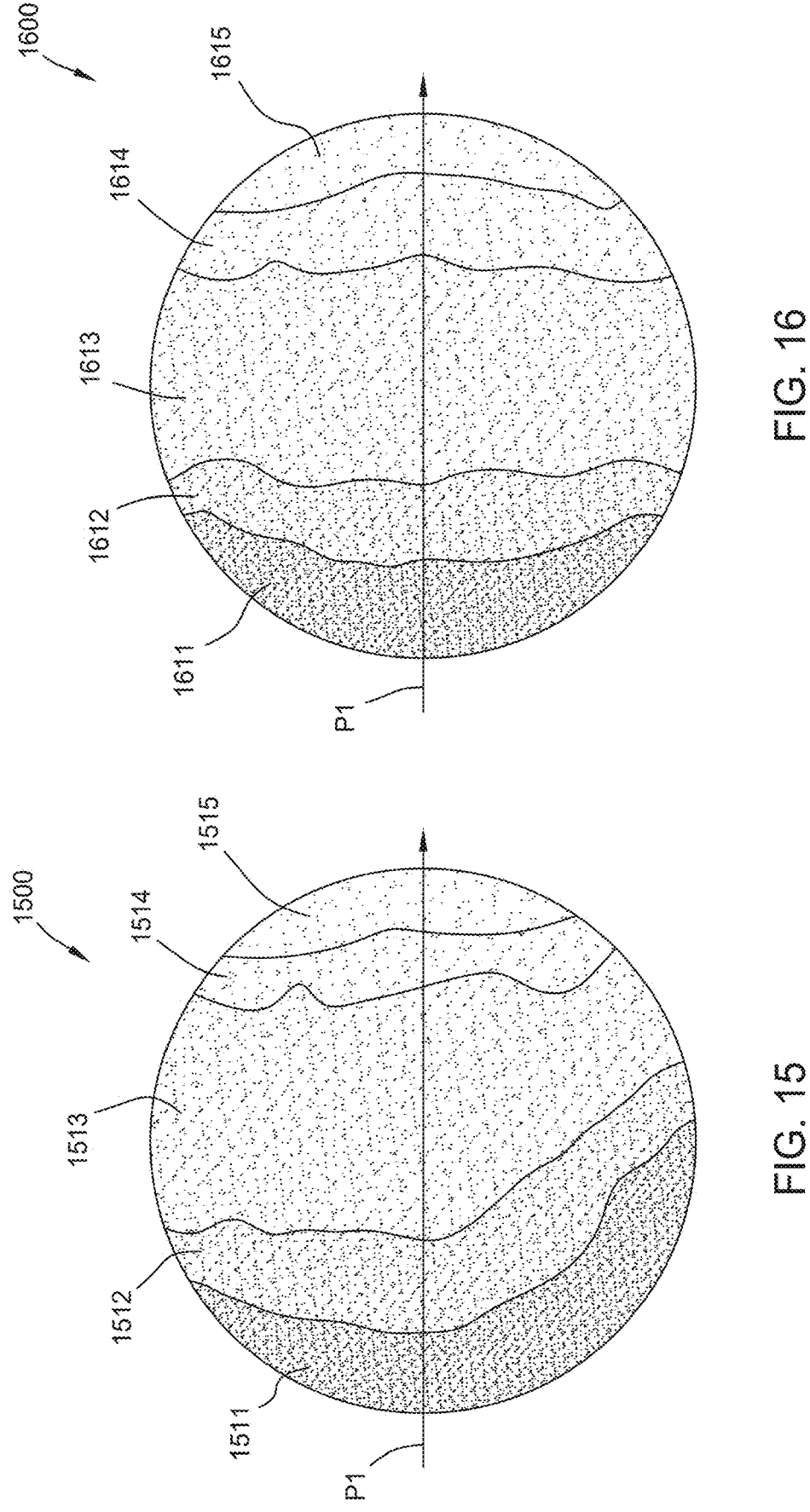
FIG. 15 illustrates schematically a deposition map, according to one or more embodiments.
FIG. 16 illustrates schematically a deposition map, according to one or more embodiments.

FIG. 15 illustrates schematically a deposition map 1500, according to one or more embodiments. The deposition map 1500 illustrates a thickness of a material deposited on a substrate. The thickness profile shown in FIG. 15 is believed to occur when a process does not use subject matter described herein. As shown, the deposition map 1500 includes a plurality of sections 1511-1515 corresponding to varying deposition thicknesses.

FIG. 16 illustrates schematically a deposition map 1600, according to one or more embodiments. The deposition map 1600 illustrates a thickness of a material deposited on a substrate. The thickness profile shown in FIG. 16 is believed to occur when a process uses subject matter (such as the fins 810 and/or the plate 111) described herein. As shown, the deposition map 1600 includes a plurality of sections 1611-1615 corresponding to varying deposition thicknesses.

By comparing the deposition map 1600 to the deposition map 1500, the subject matter described herein facilitates enhanced thermal uniformity, gas flow rate uniformity, and deposition thickness uniformity (such as center-to-edge uniformity). The subject matter also facilitates adjustability of process parameters (e.g., gas flow rates, temperature, and deposition thickness) for regions of the substrate, such as one or more outer regions of the substrate. The deposition map 1600 illustrates a more laminar flow of gases than the deposition map 1500, as shown by the more linear boundaries between the sections 1611-1615.

Figure 17:
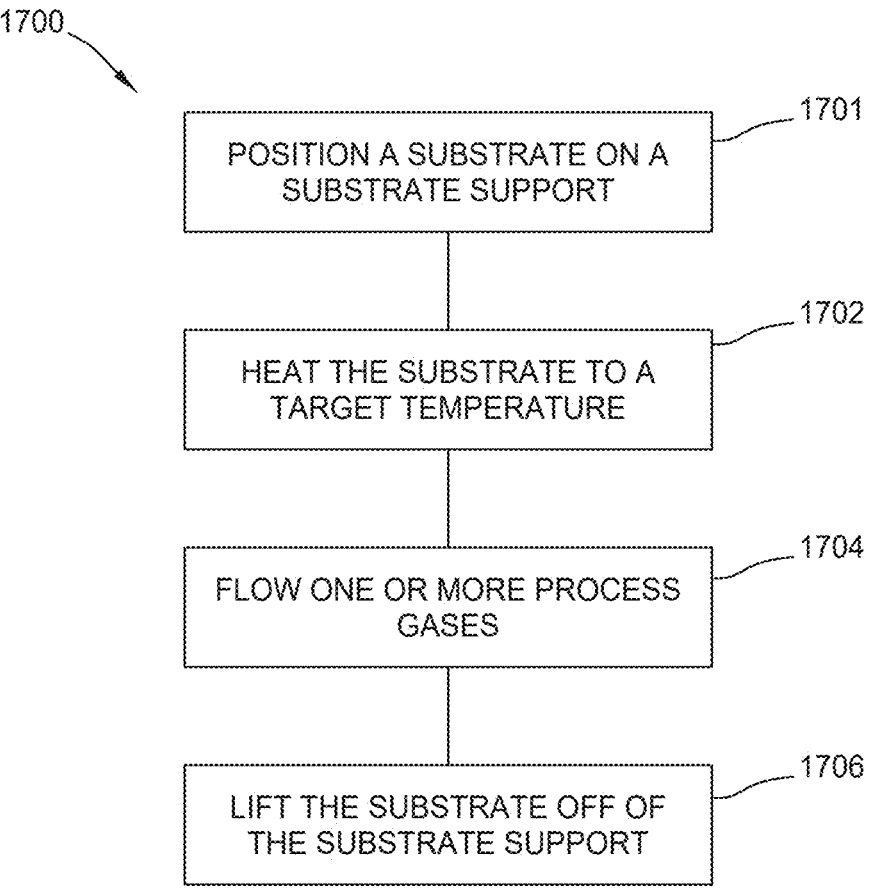
FIG. 17 is a schematic block diagram view of a method of substrate processing for semiconductor manufacturing, according to one or more embodiments.

FIG. 17 is a schematic block diagram view of a method 1700 of substrate processing for semiconductor manufacturing, according to one or more embodiments.

Operation 1701 includes positioning a substrate on a substrate support in a processing volume of a processing chamber. In one or more embodiments, the positioning includes moving a substrate support and/or a plurality of lift pins relative to each other to land the substrate on the substrate support.

Operation 1702 of the method 900 includes heating the substrate to a target temperature.

Operation 1704 includes flowing one or more process gases over the substrate to form one or more layers on the substrate.

Operation 1706 includes lifting the substrate off of the substrate support. In one or more embodiments, the lifting includes moving a substrate support and/or a plurality of lift pins relative to each other to engage the substrate with the lift pins and lift the substrate.

Figure 18:
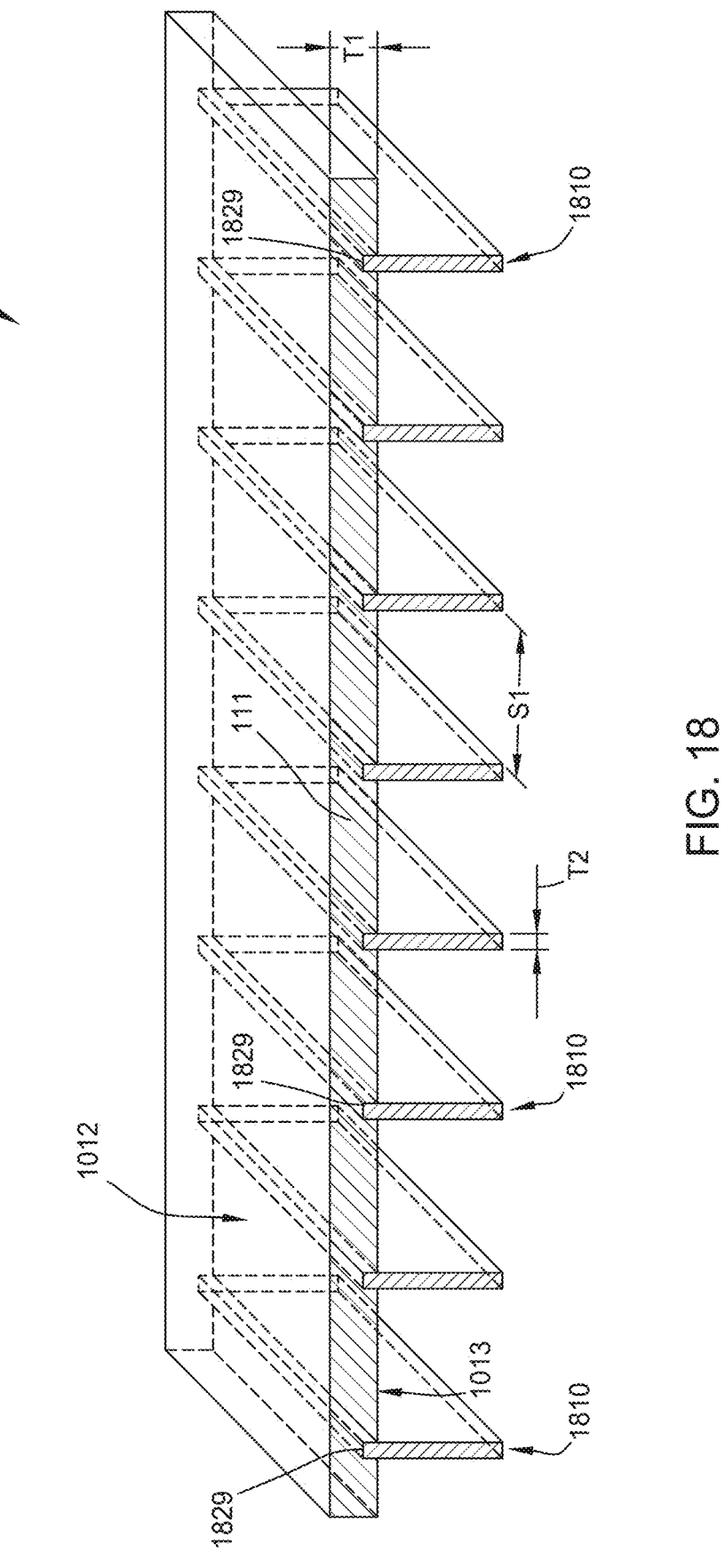
FIG. 18 is a schematic cross-sectional view of a plate apparatus, according to one or more embodiments.

FIG. 18 is a schematic cross-sectional view of a plate apparatus 1800, according to one or more embodiments.

In the implementation shown in FIG. 18, the openings 822 and the holes 824 are omitted from the plate 111. One or more fins 1810 (a plurality is shown) are coupled (e.g., to the second outer face 1013) of the plate 111. The one or more fins 1810 are similar to the fins 810 and includes one or more aspects, features, components, operations, and/or properties thereof. The first shoulder 811 and the second shoulder 812 can be omitted form one or more of the fins 810 such that the one or more of the fins 810 have a continuous rectangular cross section. In one or more embodiments, the fins 1810 are coupled to the plate 111. As an example, the fins 1810 can be welded, bonded, and/or fused to the plate 111. In one or more embodiments, the fins 1810 are disposed at least partially in openings 1829 (e.g., recesses) formed in the second outer face 1013. The present disclosure contemplates that the openings 1829 can be omitted. The present disclosure contemplates that the fins 1810 can be integrally formed with the plate 111. The present disclosure also contemplates that the fins 1810 can be supported by the plate 111, as described for example in relation to the fins 810 and the plate apparatus 800 described above.

Benefits of the present disclosure include reduced diversive flow of process gases; enhanced deposition thicknesses; enhanced deposition uniformities; more laminar gas flow (e.g., reduced or eliminated vortex effects of substrate rotation); enhanced thermal uniformities; enhanced gas flow rate uniformities; and increased throughput and efficiency; and reduced chamber downtime. Benefits of the present disclosure also include enhanced gas activation (e.g., pre-activation) while reducing or eliminating blockage of radiation that heats the substrate; increased film thickness and growth rates; and adjustability of process parameters (e.g., gas flow rates, temperature, and deposition thickness). As an example, the subject matter described herein can be used to adjust a transparency-relative-to-absorption factor for heating paths to facilitate a reduced or eliminated shadowing effect while facilitating enhanced gas activation.

It is contemplated that one or more aspects disclosed herein may be combined. As an example, one or more aspects, features, components, operations and/or properties of the processing chamber 1000, the processing chamber 2000, the plate apparatus 210, the process kit 310, the plate 111, the plate 321, the blocks 331, 332, the plate 421, the fins 410, the fins 610, the fins 710, the plate apparatus 800, the fins 810, the process kit 1100, the information of the deposition map 1600, the method 1700, and/or the fins 1810 may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof, and the scope thereof is determined by the claims that follow.

The invention claimed is:

1. A processing chamber, comprising:
one or more gas inlets operable to flow a gas into an internal volume of the processing chamber;
a substrate support disposed in the internal volume; and
a plate apparatus disposed in the internal volume and above the substrate support, the plate apparatus comprising:
a plate comprising:
a first outer face,
a second outer face opposing the first outer face, and
one or more openings formed in the first outer face and defining one or more recessed surfaces, and
one or more fins disposed at least partially below the plate, at least one of the one or more fins extending relative to the second outer face of the plate and sized and shaped for positioning in the one or more openings, and at least one of the one or more fins comprising:
a first shoulder,
a second shoulder, and
a middle section extending between the first shoulder and the second shoulder, the first shoulder and the second shoulder interfacing with at least one of the one or more recessed surfaces.

2. The processing chamber of claim 1, wherein the one or more gas inlets are operable to flow the gas between the one or more fins and over the substrate.

3. The processing chamber of claim 1, wherein the plate comprises one or more openings defining one or more recessed surfaces, and the one or more fins are disposed in the one or more openings.

4. The processing chamber of claim 1, further comprising:
a pre-heat ring disposed outwardly of the substrate support, the pre-heat ring at least partially surrounding a middle section of at least one of the one or more fins;
a window at least partially defining the internal volume; and
one or more heat sources operable to heat the internal volume.

5. The processing chamber of claim 1, wherein at least one of the one or more fins has a lower transmissivity than the plate.

6. The processing chamber of claim 5, wherein the plate is formed of a first composition, at least one of the one or more fins is formed of a second composition that is different than the first composition, the second composition comprises silicon carbide (SiC), and the first composition comprises quartz.

7. The processing chamber of claim 6, wherein the SiC has an atomic structure that is 4H, 6H, or 3C.

8. The processing chamber of claim 1, wherein:

the plate is formed of a first composition;

at least one of the one or more fins formed of a second composition that is different than the first composition; and the processing chamber further comprises a set of blocks on opposing sides of the one or more fins, the set of blocks sized and shaped to interface with the plate.

9. The processing chamber of claim 1, wherein the one or more fins including a plurality of fins spaced from each other between the set of blocks.

10. The processing chamber of claim 1, wherein the plate has a first thickness that is larger than a second thickness of at least one of the one or more fins.

11. The processing chamber of claim 8, wherein the plate has a first thickness that is larger than a second thickness of at least one of the one or more fins.

12. A process kit applicable for use in semiconductor manufacturing, the process kit comprising:

a plate formed of a first composition;

one or more fins, at least one of the one or more fins formed of a second composition that is different than the first composition, the at least one of the one or more fins comprising a first shoulder, a second shoulder, and a middle section extending between the first shoulder and the second shoulder; and a ring sized and shaped to at least partially surround the middle section of the one or more fins, the ring comprising one or more openings defining one or more recessed surfaces, the at least one of the one or more fins sized and shaped for positioning in the one or more openings, and the first shoulder and second shoulder sized and shaped to interface with at least one of the one or more recessed surfaces.

13. The plate apparatus of claim 12, wherein the second composition comprises one or more of black quartz, graphite, or SiC, and the first composition comprises transparent quartz.

14. A process kit, comprising:

the plate apparatus of claim 12; and a set of blocks on opposing sides of the one or more fins, the set of blocks sized and shaped to interface with the plate, and the one or more fins including a plurality of fins spaced from each other between the set of blocks.

15. The plate apparatus of claim 12, wherein the plate has a first thickness that is larger than a second thickness of at least one of the one or more fins.

16. A processing chamber, comprising:

a substrate support disposed in a processing volume of the processing chamber;

a first pre-heat ring disposed in the processing volume;

a second pre-heat ring disposed in the processing volume below the first pre-heat ring;

one or more gas inlets at least partially between the first pre-heat ring and the second pre-heat ring, the one or more gas inlets operable to flow a gas between the first pre-heat ring and the second pre-heat ring and into the processing volume of the processing chamber; and a set of blocks supported on the second pre-heat ring and disposed between the first pre-heat ring and the second pre-heat ring.

17. The processing chamber of claim 16, wherein the first pre-heat ring comprises one or more openings defining one or more recessed surfaces.

18. The processing chamber of claim 16, wherein the set of blocks comprise extensions extending through openings formed in the first pre-heat ring.

19. The processing chamber of claim 16, wherein the first pre-heat ring and the second pre-heat ring are formed of silicon carbide (SiC) or graphite coated with SiC.

20. The processing chamber of claim 16, wherein the first pre-heat ring and the second pre-heat ring are formed of an opaque material that pre-heats the gas prior to flowing into the processing volume.

* * * * *